(12) United States Patent
Smigelski (10) Patent No.: US 10,727,813 B2
(45) Date of Patent: Jul. 28, 2020

(54) FRACTIONAL SCALING DIGITAL SIGNAL PROCESSING

(71) Applicant: Jeffrey R. Smigelski, Dayton, OH (US)

(72) Inventor: Jeffrey R. Smigelski, Dayton, OH (US)

(*) Notice: Subject to any disclaimer, the term of this patent is extended or adjusted under 35 U.S.C. 154(b) by 0 days.

(21) Appl. No.: 16/320,040

(22) PCT Filed: Jul. 27, 2017

(86) PCT No.: PCT/US2017/044257
§ 371 (c)(1),
(2) Date: Jan. 23, 2019

(87) PCT Pub. No.: WO2018/022942
PCT Pub. Date: Feb. 1, 2018

(65) Prior Publication Data
US 2019/0229708 A1    Jul. 25, 2019

Related U.S. Application Data

(60) Provisional application No. 62/367,464, filed on Jul. 27, 2016.

(51) Int. Cl.
*H03H 17/06* (2006.01)
*G06F 7/58* (2006.01)
*H03H 17/02* (2006.01)
*H04B 1/16* (2006.01)
*H03H 17/00* (2006.01)

(52) U.S. Cl.
CPC .......... *H03H 17/0685* (2013.01); *G06F 7/58* (2013.01); *H03H 17/0213* (2013.01); *H04B 1/16* (2013.01); *H03H 2017/0072* (2013.01); *H03H 2017/0298* (2013.01)

(58) Field of Classification Search
CPC .................. H04L 27/0014; H04L 27/2675
See application file for complete search history.

(56) References Cited

U.S. PATENT DOCUMENTS

| | | | |
|---|---|---|---|
| 4,503,401 A | 3/1985 | Kyriakos et al. | |
| 4,649,388 A | 3/1987 | Atlas | |
| 2005/0080831 A1 | 4/2005 | Pickerd et al. | |
| 2013/0268219 A1* | 10/2013 | Malek | G01R 21/06 702/60 |
| 2015/0058388 A1 | 2/2015 | Smigelski | |
| 2017/0338761 A1* | 11/2017 | Malek | B60L 50/10 |

FOREIGN PATENT DOCUMENTS

WO    2016/029066 A1    2/2016

* cited by examiner

*Primary Examiner* — Shuwang Liu
*Assistant Examiner* — Gina M McKie
(74) *Attorney, Agent, or Firm* — Hall Estill Attorneys at Law; Tyler J. Mantooth (57) ABSTRACT

A process for processing a digital signal comprises constructing a fractional order control system that models a desired frequency response by assembling filter components from a filter component library. The filter components are defined by Laplace functions that include a non-integer control order having a variable fractional scaling exponent. Then, the fractional order control system is adjusted by applying an altitude exponent to the fractional order control system, and the altitude exponent changes a magnitude of the frequency response without changing a width of a transition band of the frequency response. An input signal in the digital frequency domain is received and processed based upon the fractional order control system to generate a digital output that is conveyed.

14 Claims, 9 Drawing Sheets

FRACTIONAL SCALING DIGITAL SIGNAL PROCESSING

TECHNICAL FIELD

Various aspects of the present invention relate generally to digital signal processing, and specifically to constructing filters and adjusting non-zero portions of the frequency response of the filter using an altitude exponent.

BACKGROUND ART

Numerous signal processing techniques exist to filter or otherwise model a digital representation of a system of interest. However, such signal processing techniques are limited in their ability to accurately filter and reconstruct the system of interest due to artifacts of the processing technique. Artifacts often manifest as ripples, a wide transition bandwidth, slow roll-off, etc. Artifacts can also obscure or alter the relevant signal within the filtered data set resulting in a loss of information from the signal.

DISCLOSURE OF INVENTION

According to aspects of the present disclosure, a process for processing a digital signal comprises constructing a fractional order control system that models a desired frequency response by assembling filter components from a filter component library. The filter components are defined by Laplace functions that include a non-integer control order having a variable fractional scaling exponent. Then, the fractional order control system is adjusted by applying an altitude exponent to the fractional order control system, and the altitude exponent changes a magnitude of the frequency response without changing a width of a transition band of the frequency response. An input signal in the digital frequency domain is received and processed based upon the fractional order control system to generate a digital output that is conveyed.

Applications for the process described above include software defined radio, equalizers, and other general filtering and signal processing functions.

MODES FOR CARRYING OUT THE INVENTION

According to aspects of the present disclosure, a frequency response of a digital filter may be scaled using an altitude exponent. In digital filtering, there are passbands, where frequencies of an input signal are typically allowed to pass or even be amplified, and stopbands, where frequencies of the input signal are typically attenuated. Areas between the pass bands and the stop bands are called transition bands and include a non-zero slope. Using the altitude exponents described herein, the amplification/attenuation of the pass/stop bands may be altered without affecting the width of the transition bands that surround the altered pass/stop bands. Further, the altitude exponents described herein may be used to adjust a slope within a pass/stop band if that band has a non-zero slope.

As used herein, passband and stopband may be interchangeable depending on a sign and value of the altitude exponent. For example, a passband with a negative altitude exponent may attenuate a signal, as described below. Basically, as used herein, a passband and a stopband may be an active band that either attenuates, amplifies, or passes frequencies depending on the value of the altitude exponent.

Moreover, a unit filter may be created using a simple passband filter with an associated altitude exponent. Several of the unit filters may be strung together such that a leading transition band of one unit filter overlaps a trailing transition band of a second unit filter.

Figure 1:
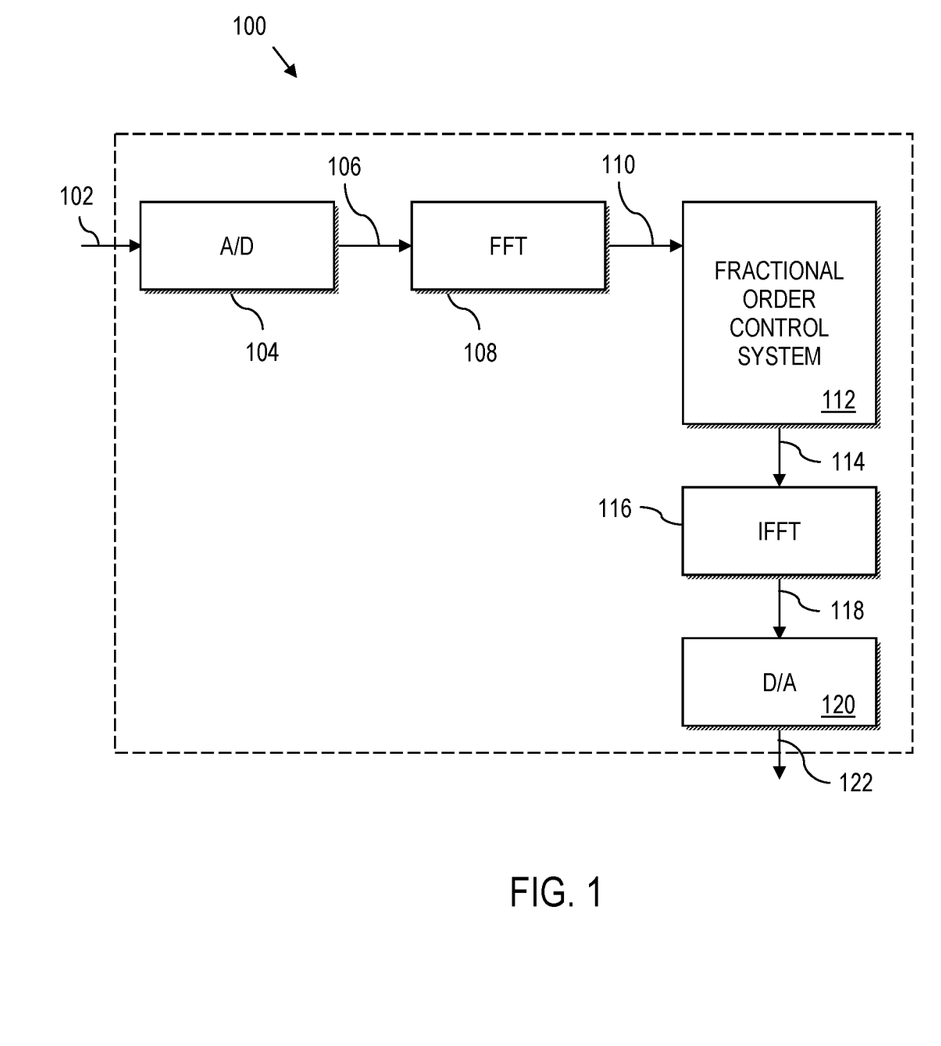
FIG. 1 is a block diagram of a system for filtering signals, according to various aspects of the present disclosure.

Referring to drawings and in particular FIG. 1, a system 100 for filtering a signal is shown. An analog input signal 102 enters an analog-to-digital (A/D) converter 104, which converts the analog input signal to a digital signal 106 in the time domain, which enters a fast Fourier transform (FFT) module 108 that transforms the time domain digital signal 106 to a frequency-domain digital signal 110 (e.g., a rectangular notation of $X[s]=x_{[s]}+jy_{[s]}$). Then, the frequency-domain digital signal 110 enters a fractional order control system 112 that filters the frequency-domain digital signal 110 according to a desired frequency response.

The resulting filtered digital signal 114 passes through an inverse FFT module 116 to convert the filtered digital signal from the frequency domain to the time domain, and the resulting signal 118 is passed through a digital-to-analog converter 120 to convert to a filtered analog output signal 122.

The A/D 104, FFT 108, IFFT 116, and D/A 120 may be standard components; however, the fractional order control system 112 is unconventional and uses a fractional scaling process described in U.S. Patent Application Publication No. 2015/0058388 A1 entitled "Fractional Scaling Digital Filters and the Generation of Standardized Noise and Synthetic Data Series" by Smigelski, the entirety of which is hereby incorporated by reference and corresponding Patent Cooperation Treaty Application No. WO2016/029066 entitled "Fractional Scaling Digital Signal Processing" by Smigelski, the entirety of which is hereby incorporated by reference. Basically, a frequency response is constructed using filter components from a library, where the filter components use fractional scaling. For example, the library may include a high-frequency amplifier and a low pass filter along with other components. A transfer function for a high-frequency amplifier is $$\left(\frac{s+k}{k}\right)_{\frac{\beta}{2}}$$

wherein s is the Laplacian complex variable representing a complex frequency (jω), k is gain value frequency, and β is a fractional scaling exponent, non-integer control order representing a variable fractional scaling exponent. A transfer function for the low-pass filter component may be $$\left(\frac{k}{s+k}\right)_{\frac{\beta}{2}}.$$

Other components have other transfer functions as described in U.S. Patent Application Publication No. 2015/0058388 A1 and corresponding PCT Application WO2016/029066.

According to aspects of the present disclosure, an altitude exponent (represented by æ) may be added to each filter component individually to adjust the magnitude of the filter response for that component without changing the gain frequencies of those components, as described in greater detail herein. Thus, a new transfer function for the high-frequency amplifier may be $$\left[\left(\frac{s+k}{k}\right)_{\frac{\beta}{2}}\right]^{ae}$$

and a new transfer function for the low-pass filter component may be $$\left[\left(\frac{k}{s+k}\right)_{\frac{\beta}{2}}\right]^{ae}.$$

Phase may also be adjusted (separately from an amplitude adjustment or concurrently with an amplitude adjustment) using the altitude exponent in a similar fashion using the phase transfer functions as described in U.S. Patent Application Publication No. 2015/0058388 A1 and corresponding PCT Application WO2016/029066.

Figure 2:
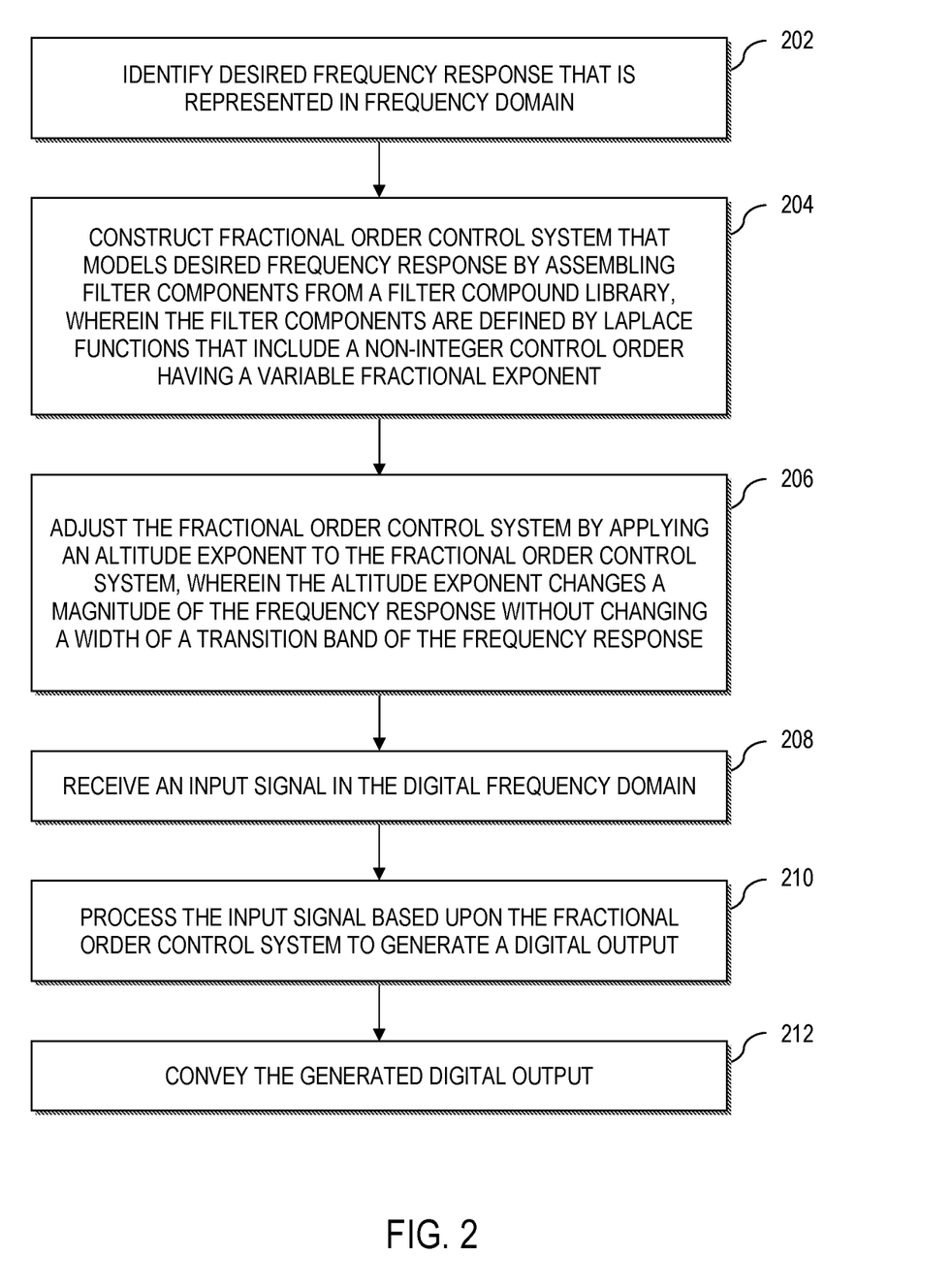
FIG. 2 is a flow chart illustrating a process for scaling non-zero portions of a frequency response of a digital filter without adjusting a width of a transition band of the frequency response, according to various aspects of the present disclosure.

Referring now to FIG. 2, a process 200 for processing a digital signal is presented. In this regard, the method 200 may be implemented on computer-readable hardware that stores machine-executable program code, where the program code instructs a processor to implement the described method. The method 200 may also be executed by a processor coupled to memory, where the processor is programmed by program code stored in the memory, to perform the described method. Further, the method 200 may be implemented in hardware.

At 202, a desired frequency response that is represented in a frequency domain representation is identified. For example, if noise at 60 hertz (Hz) is a problem in a system, then the desired frequency response may be a notch filter centered around 60 Hz.

At 204, a fractional order control system (e.g., a filter) is created that models the desired frequency response. To create the fractional order control system, filter components from a filter component library (e.g., see U.S. Patent Application Publication No. 2015/0058388 A1 and corresponding PCT Application WO2016/029066) may be assembled. The filter components may be defined by Laplace functions that include a non-integer control order having a variable fractional scaling exponent, as described above. An example of a band-pass filter fractional order control system is discussed in greater detail with reference to FIG. 3.

At 206, the fractional order control system is adjusted by applying an altitude exponent to the fractional order control system such that the altitude exponent changes a magnitude of the frequency response without changing a width of a transition band. The altitude exponent applies to a complex number array of the fractional order control system, so the fractional order control system may be adjusted after the equations (i.e., transfer functions) for the fractional order control system have been solved.

At 208, a digital input signal is received, where the digital input signal is represented in the frequency domain. For example, if a digital input signal is the time domain, then that signal may be passed through a Fourier transform, fast Fourier transform, etc. to convert the time domain representation to a complex frequency domain representation. Other conversions may be used as well.

At 210, the digital input signal in the frequency domain is processed using the fractional order control system to generate an output signal that may be in the frequency domain or in the time domain as desired, and at 212, that output signal is conveyed.

Figure 3:
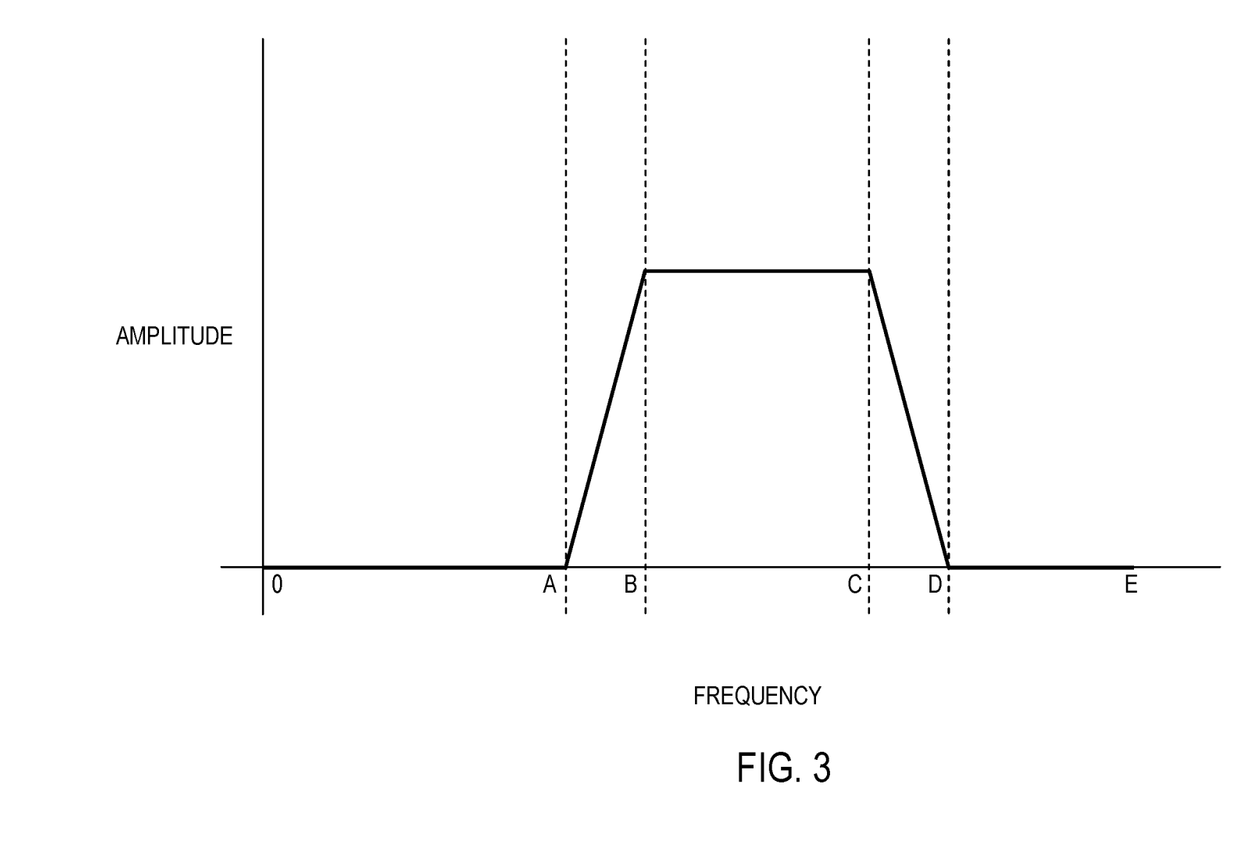
FIG. 3 is a graph illustrating a frequency response of a first filter with a flat passband that may be affected by an altitude exponent using the process of FIG. 2, according to various aspects of the present disclosure.

FIG. 3 is a graph illustrating a frequency response of a band-pass filter fractional order control system with a flat band using the process of FIG. 2. To construct the bandpass filter fractional order control system, four or five components from the filter library may be used. For example, an equation for the bandpass filter of FIG. 3 may be:

$$\left[\left(\frac{s+k}{k}\right)_{\frac{\beta}{2}}\left(\frac{k}{s+k}\right)_{\frac{\beta}{2}}\left(\frac{k}{s+k}\right)_{\frac{\beta}{2}}\left(\frac{s+k}{k}\right)_{\frac{\beta}{2}}\right]^{ae}.$$

Alternatively, a different altitude component may be used for different portions of the filter.

For example, a high-frequency amplifier with a gain frequency of A may be used create the filter segment 0AB. Initially, the slope of line segment AB is dependent on the value of β for this first filter component. A low-pass filter component with a gain frequency of B may be used as the second filter component to create filter segment BC. The value of β for the second filter component should be the same as of the value of β for the first filter component to create the flat (i.e., zero-sloped) passband. The third filter component may be another low-pass filter with a gain frequency of C to create filter segment CD, and a second high-frequency amplifier may be used as the fourth component to create the segment of the filter with gain frequency of D. A fifth filter component (e.g., a multiplier or an integrator) may be used as an overall shifting factor to shift the entire filter up or down the amplitude axis (using just K, as described herein), to apply a slope to the entire fractional order control system (using an integrator $$\left.\frac{K}{s^{\frac{\beta}{2}}}\right),$$

or both; however, such an overall shifting factor is not shown in FIG. 3. Note that the passband, segment BC, is surrounded by two transition bands AB and CD.

The solid line showing the filter illustrates the frequency response of the bandpass filter fractional order control system before the altitude exponent is applied to the fractional order control system. However, when the altitude exponent is applied to the fractional order control system, the height of the passband will change. For example, if a positive number greater than one is applied as the altitude exponent, then the pass band will be raised and the slope of the transition band will be increased, but the width of the transition bands does not change. As another example, if a positive number less than one is applied as the altitude exponent, then the passband will be lowered and the slope of the transition band will be decreased, but the width of the transition bands does not change.

As another example, if a negative number is applied as the altitude exponent, then the pass band will flip to be converted to a stop band, but the width of the transition bands does not change. Thus, if a negative altitude exponent is applied, then the passband filter may be turned into a notch filter (i.e., stop-band filter) by applying a negative altitude exponent.

Further, if phase is implemented in the fractional order control system, then the altitude exponent will affect the phase of the frequency response of the components with a non-zero slope—either in conjunction with the amplitude or separately from the amplitude. For example, with a negative altitude exponent, the phase of filter components with a non-zero slope will flip as well as be adjusted in phase angle. For a positive altitude exponent, the phase of filter components with a non-zero slope will be adjusted in phase angle. If a portion of the fractional order control system includes a non-zero slope, then that slope is affected by the altitude exponent. If phase is not implemented in the fractional order control system, then the altitude exponent will not introduce any phase change.

The altitude exponent affects all non-zero portions of the fractional order control system in magnitude, so the fractional order control system may be shifted up or down using an overall shifting factor (represented by multiplier K as described in U.S. Patent Application Publication No. 2015/0058388 A1 and corresponding PCT Application WO2016/029066) to change which segments of the fractional order control system are affected by the altitude exponent.

Moreover, the altitude exponent may be any number, including non-integers.

Further, each component or frequency of the fractional order control system may have its own altitude exponent, be affected by an overall altitude exponent, be affected by an altitude exponent of another component, and combinations thereof. For example, in the example of FIG. 5, the first two components (i.e., the first component (segment 0A) and second component (segment AB)) may be controlled by a first altitude exponent, while the second two components (i.e., the third component (segment BC) and fourth component (segment CD)) may be controlled by a second altitude exponent. A transition between the two altitude exponents merely has to take place somewhere within the passband, preferably but not necessarily the middle for symmetry.

As another example, in a complex fractional order control system, several notch, bandpass, or both filters can be linked together and then the level of each stopband amplification or attenuation for each notch filter can be completely controlled by one independent altitude exponent. Thus, a graphic equalizer may be designed where there are as many altitude exponents as there are frequency ranges of stopbands to fully adjust the fractional order control system with a dial that changes the value of the altitude exponent. (In the notch filter, the altitude exponent is wrapped around the entire notch filter, which comprises several main filter components.)

As such, a unit filter may be created using a passband filter with a passband of a certain frequency width (e.g., one Hertz, several Hertz, etc.) using the formula discussed above for the bandpass filter:

$$\left[\left(\frac{s+k}{k}\right)_{\frac{\beta}{2}}\left(\frac{k}{s+k}\right)_{\frac{\beta}{2}}\left(\frac{k}{s+k}\right)_{\frac{\beta}{2}}\left(\frac{s+k}{k}\right)_{\frac{\beta}{2}}\right]^{ae}.$$

Then, several of these unit filters may be linked together such that a trailing transition of a unit filter overlaps a leading transition band of a subsequent unit filter, as discussed in relation to FIG. 6 below. Each unit filter may have its own altitude exponent so every unit filter of an overall filter can be adjusted separately using the altitude exponents associated with that unit filter. This concept is discussed in greater detail in relation to FIG. 6 below.

Figure 4:
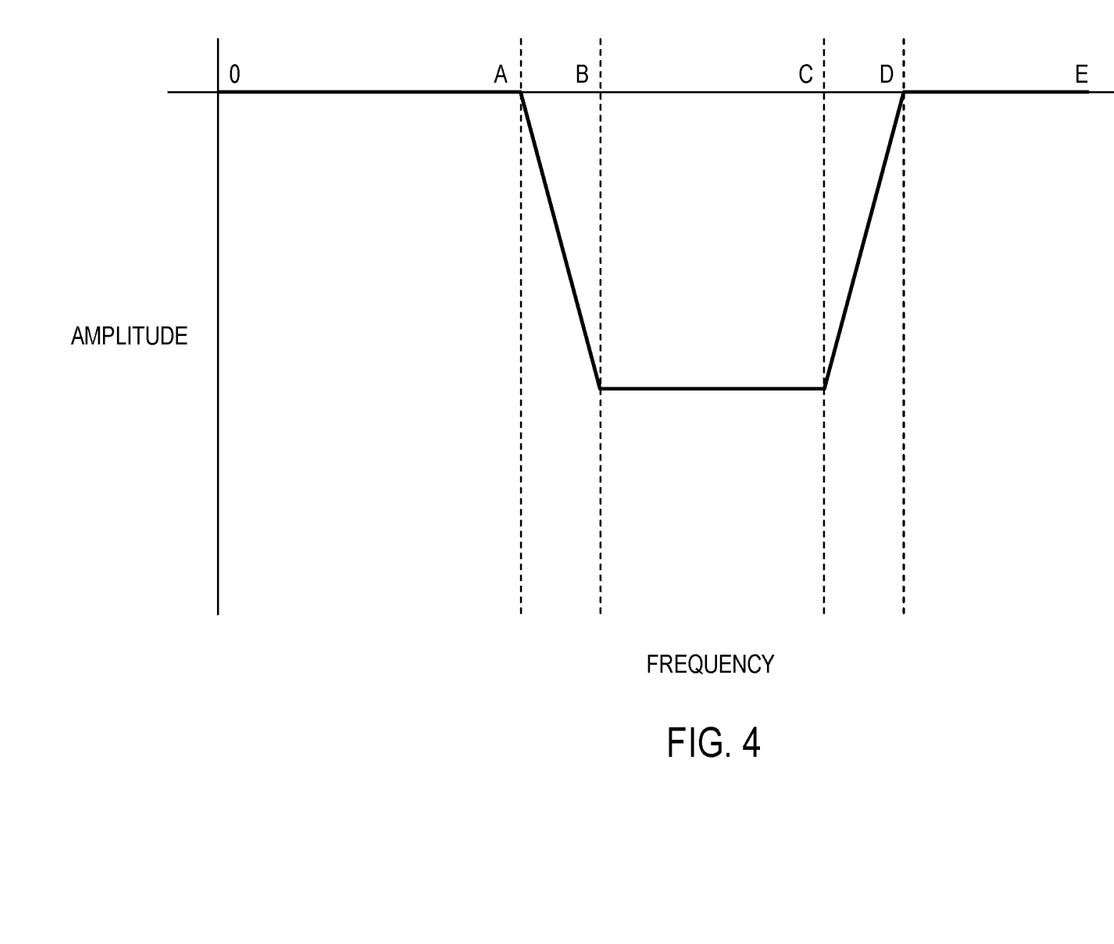
FIG. 4 is a graph illustrating a frequency response of a second filter with a flat stopband that may be affected by an altitude exponent using the process of FIG. 2, according to various aspects of the present disclosure.

As noted above and referring to FIG. 4, the altitude exponent affects only non-zero portions of the fractional order control system. Therefore, the non-notch portion (i.e., sidebands (i.e., segments 0A and DE)) of the notch filter should be zero, so the adjusted portion of the notch filter does not cross the zero axis when adjusted (unless the altitude exponent is negative, which will flip the adjusted portion from positive to negative or vice versa). An overall scaling factor may be used to shift the notch filter to ensure that the non-notch portions (i.e., sidebands) are at zero.

Similarly referring back to FIG. 3, non-pass portions (i.e., sidebands (i.e., segments 0A and DE)) of a bandpass filter should be zero, so the adjusted portion of the bandpass filter does not cross the zero axis when adjusted (unless the altitude exponent is negative, which will flip the adjusted portion from positive to negative or vice versa). An overall scaling factor may be used to shift the bandpass filter to ensure that the non-pass portions are at zero.

Figure 5:
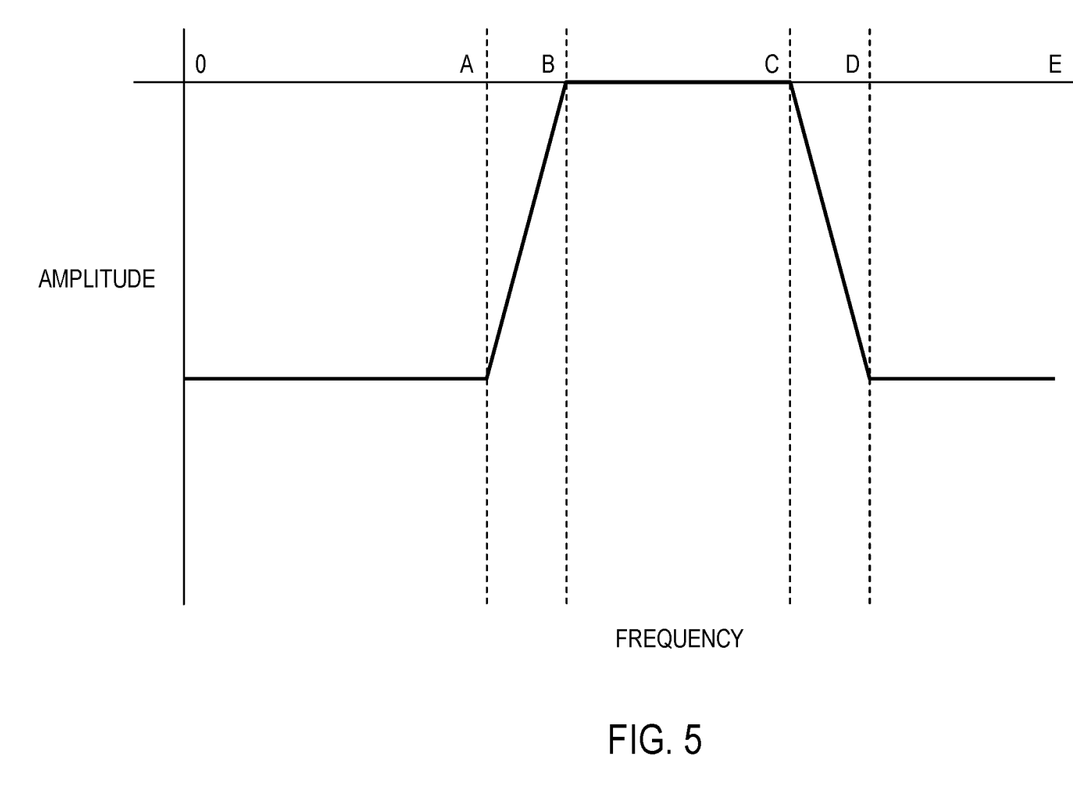
FIG. 5 is a graph illustrating a frequency response of a third filter with sidebands that may be affected by an altitude exponent using the process of FIG. 2, according to various aspects of the present disclosure.

As another example referring to FIG. 5, in a software defined radio, it may be desirous to adjust the sidebands (i.e., non-pass portions (i.e., segments 0A and DE)) and keep the passband the same. In such a case, the passband should be set to zero, while the sidebands are non-zero. One way to achieve this is to use an overall shifting factor (i.e., K) to adjust the software defined radio filter such that the passband is at zero. Then when the altitude exponent is applied to the fractional order control system, the sidebands are adjusted, while the passband remains unchanged.

Figure 6:
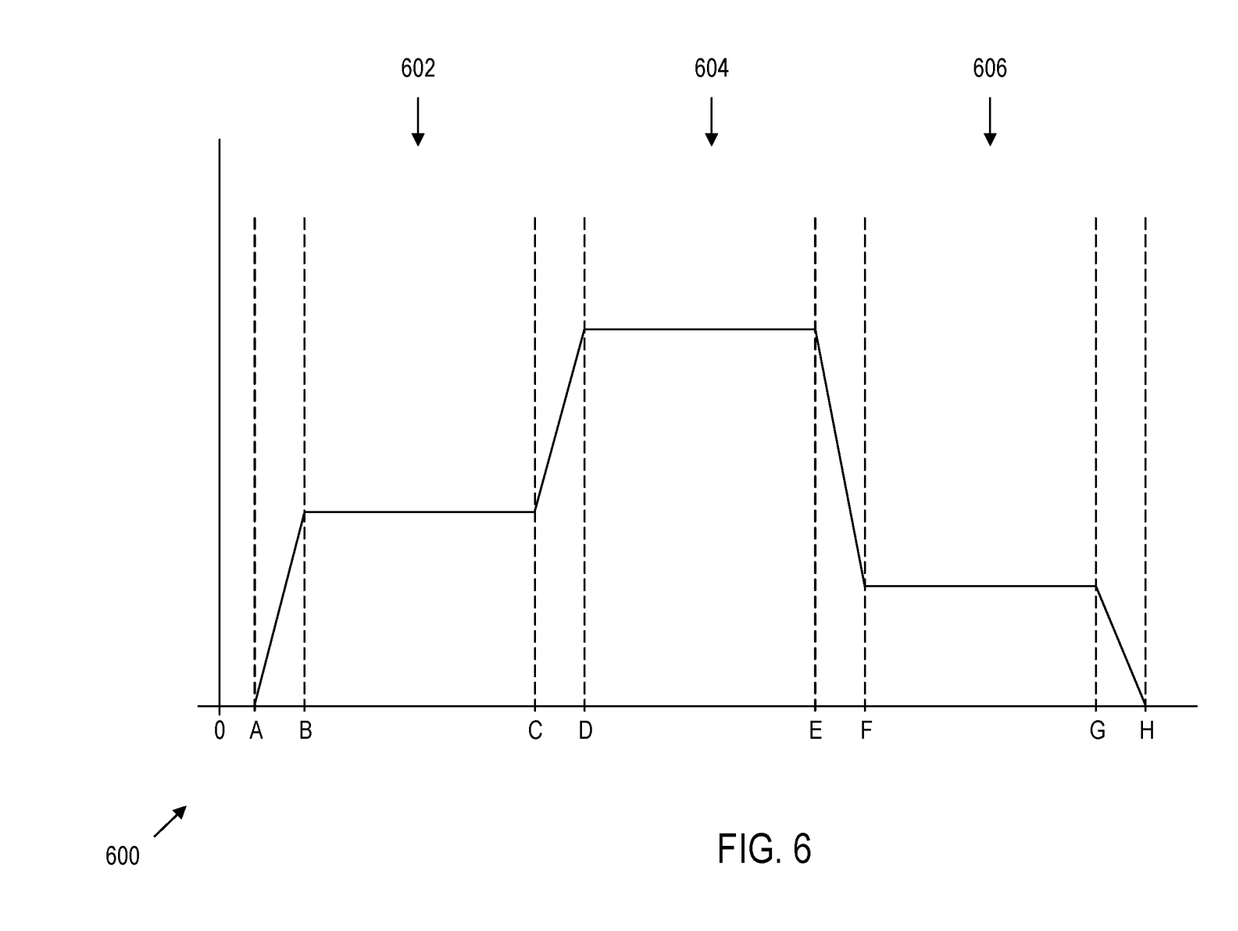
FIG. 6 is a graph illustrating a frequency response of several unit filters creating an overall filter, where each unit filter is affected by a separate altitude exponent, according to various aspects of the present disclosure.

FIG. 6 illustrates an overall filter 600 created by several unit filters 602, 604, 606. As discussed above a unit filter is a bandpass filter created by using four components of a filter library $$\left[\left(\frac{s+k}{k}\right)_{\frac{\beta}{2}}\left(\frac{k}{s+k}\right)_{\frac{\beta}{2}}\left(\frac{k}{s+k}\right)_{\frac{\beta}{2}}\left(\frac{s+k}{k}\right)_{\frac{\beta}{2}}\right].$$

Further, an altitude exponent (æ) is applied to the unit filter as a whole, such that the equation for the unit filter is:

$$\left[\left(\frac{s+k}{k}\right)_{\frac{\beta}{2}}\left(\frac{k}{s+k}\right)_{\frac{\beta}{2}}\left(\frac{k}{s+k}\right)_{\frac{\beta}{2}}\left(\frac{s+k}{k}\right)_{\frac{\beta}{2}}\right]^{ae}.$$

As mentioned above, by changing the altitude exponent, the height of the passband will raise or lower. Note that a unit filter has an amplitude (that changes with different values of the altitude exponent) for the passband and a fixed frequency width of the passband and sidebands that do not change based on the value of the altitude exponent.

To create the overall filter 600, the unit filters 602, 604, 606 are set up such that a trailing transition band of a first unit filter overlaps a leading transition band of a second unit filter. For example, a first unit filter 602 includes a leading transition band AB, a passband BC, and a trailing transition band CD. A second unit 604 filter includes a leading transition band CD, a passband DE, and a trailing transition band EF. Further, a third unit 604 filter includes a leading transition band EF, a passband FG, and a trailing transition band GH. Thus, the trailing transition band CD of the first unit filter 602 overlaps (in the frequency domain) the leading transition band CD of the second unit filter 604. In that region, the frequency response is the addition of those two filters, such that if the altitude exponents of both the first unit filter 602 and the second unit filter 604 are identical, then the transition band CD is flat at the amplitude of the passbands BC, DE of both unit filters. Further, in several embodiments, the transition bands should be as narrow as possible to maximize a number of frequencies in the passband.

Again, each unit filter 602, 604, 606 includes a separate altitude exponent so each unit filter may be adjusted to a desired height. For example, in the overall filter 600 of FIG. 6, the amplitude exponent for the first unit filter 602 is less than the altitude exponent for the second unit filter 604, but larger than the altitude exponent for the third unit filter 606. Note that because the widths of the transition bands do not change with regard to the value of the altitude exponent, the altitude exponent of one unit filter does not affect the passband region of any of the other unit filters.

As shown, there are only three unit filters 602, 604, 606 used to create the overall filter 600. However, any number of unit filters may be used. For example, if the width of a unit filter is one hertz, then an overall filter from zero to one megahertz (MHz) will be one million unit filters. As another example, if the width of the unit filter is ten hertz, then an overall filter from twenty to twenty thousand hertz would require one-thousand nine-hundred ninety-eight unit filters. Note that portions of the frequency domain that are to be unaffected by the unit filters (e.g., 0 to A and H to infinity in FIG. 6) may be suppressed using a bandpass filter (e.g., created using the filter components described in U.S. Patent Application Publication No. 2015/0058388 A1). The overall filter can be used as the fractional order control system described above.

As discussed herein, the frequency response for the unit filter is an magnitude. However, a phase may also be used instead of the amplitude or in conjunction with the amplitude. As such, there may be one transfer function (i.e., the function for the fractional scaling filter 112 of FIG. 1) for magnitude and another transfer function for phase.

Further, the filters described herein may be used in any sort of digital signal processing application. For example, an audio mixer or equalizer can be created by linking together several of the unit filters as described above. Adaptive filters may be created, where changing a portion of the filter adaptively does not affect other portions of the adaptive filter.

As another example, a person's speech may be altered using phonemes. Phonemes are perceptually distinct units of sound in a specified language that distinguish one sound from another. Thus, a system may be created that includes a library of phonemes may be created for a user and a desired output voice. Thus, when a user speaks into the system (e.g., via a microphone), the system detects the user's phonemes and calculates a filter based on the user's voice and the desired output. For example, the filter may be a difference between the input (i.e., the user's voice) and the desired voice output. The resulting output is the phoneme in the desired output voice.

Other examples of uses include audio signal processing synthesizer envelopes, magnitude only phase agnostic audio filter, image processing, image recognition, signal encoding/decoding, cryptography, autonomous vehicles, internet of things sensor endpoint signal recognition, DNA nanopore processing, SONAR, RADAR, radio frequency communications, bio-signals data analysis (e.g., Raman spectroscopy), hyperspectral imaging, electrocardiogram processing, electroencephalogram processing, etc.

Figure 7:
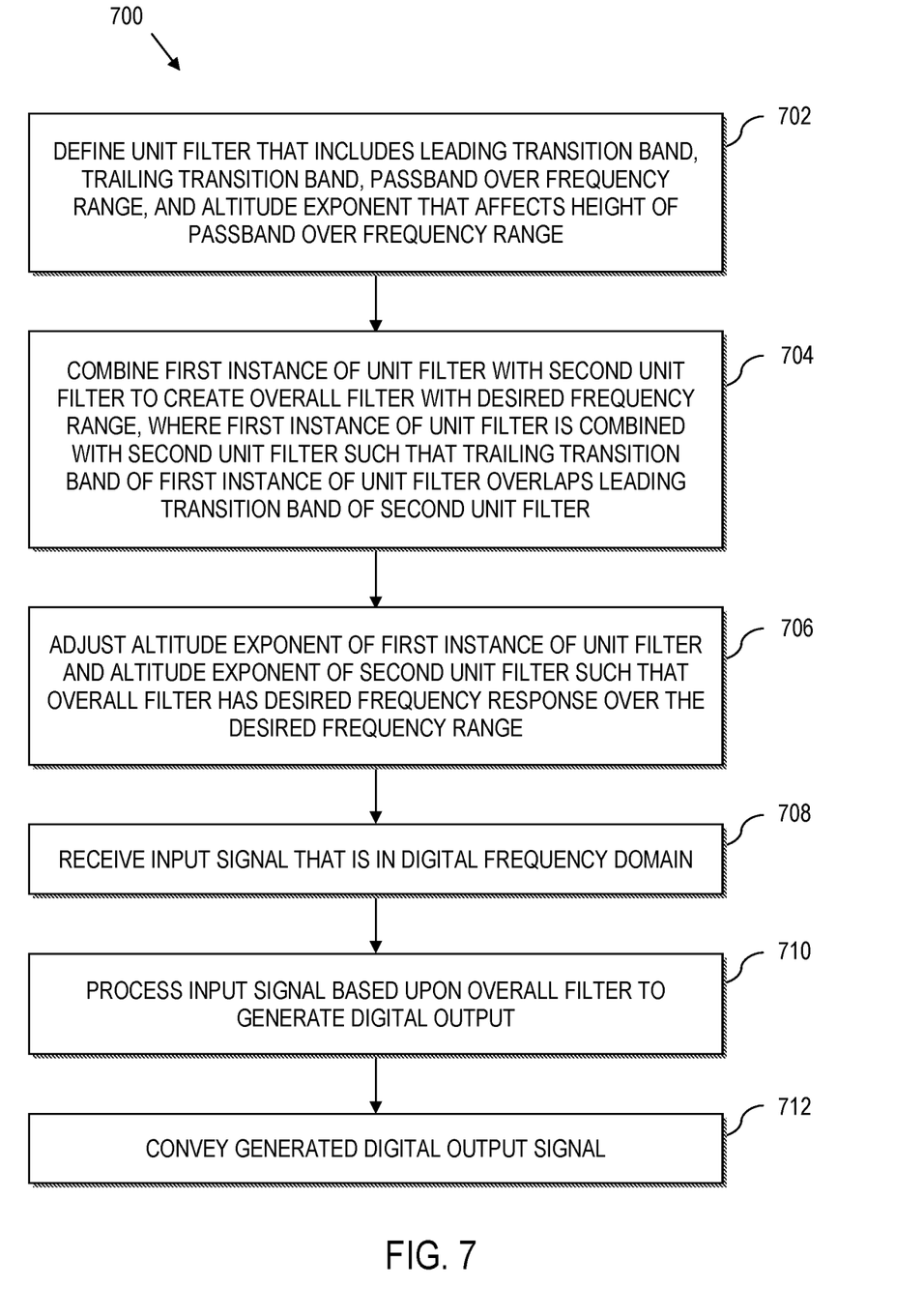
FIG. 7 is a flow chart illustrating a process for processing a digital signal using an overall filter with a desired frequency response using unit filters, according to various aspects of the present disclosure.

FIG. 7 discloses a process 700 for processing a digital input signal. At 702, a unit filter is defined as including a leading transition band, a trailing transition band, a passband over a frequency range, and an altitude exponent that affects a height of the passband over the frequency range. For example, the unit filter may be a filter similar to the filter of FIG. 3 over a one-hertz frequency range for the passband. As another example, the unit filter may be over a two-hundred hertz frequency range.

At 704, a first instance of the unit filter based on the defined unit filter is combined with a second unit filter to create an overall filter with a desired frequency range. As described above, the unit filters may have all the same frequency ranges (i.e., the second unit filter may be a second instance of the defined unit filter). However, the second unit filter may have a different frequency range than the first unit filter. The unit filters are combined such that the trailing transition band of the first instance of the unit filter overlaps the leading transition band of the second unit filter. While the passbands of the two unit filters may have a different frequency range, the leading transition band of the second unit filter should be the same as the trailing transition band of the first instance of the unit filter. However, it is not necessary that the leading transition band of the second unit filter should be the same as the trailing transition band of the first instance of the unit filter.

In the phoneme application above, the desired range of the overall filter frequency range may be the audible frequency range (i.e., 20-20,000 Hz), may be only the range of frequencies of the human voice range (i.e., approximately 70-400 Hz), a range of frequencies associated with a specific phoneme, etc.

At 706, the altitude exponents of the frequencies associated with the first instance of the unit filter and the frequencies associated with the second unit filter are adjusted to match a desired frequency response over the desired range. For example, in the phoneme example above, a frequency response of a user saying a certain phoneme is subtracted from a desired output voice saying the certain phoneme to create an overall desired frequency response. The altitude exponents are derived from that overall frequency response and used to adjust the overall filter to re-create the overall frequency response. Phonemes are just an example; any input can be subtracted from a desired output to build a desired frequency response. As another example, the desired frequency response may be derived from a user drawing the desired frequency response via a graphical user interface, and then the altitude exponents may be derived from that desired frequency response. Then when the altitude exponents of the unit filters are adjusted accordingly, the overall filter will have the desired frequency response.

At 708, a digital input signal is received, where the digital input signal is represented in the frequency domain. For example, if a digital input signal is the time domain, then that signal may be passed through a Fourier transform, fast Fourier transform, etc. to convert the time domain representation to a frequency domain representation. Other conversions may be used as well.

At 710, the digital input signal in the frequency domain is processed using the fractional order control system to generate an output signal that may be in the frequency domain or in the time domain as desired, and at 712, that output signal is conveyed.

Another concept is using an integrator component from the filter library as a base filter (i.e., as a preliminary fractional order control system) that includes several frequency regions, where each region is modified by a separate altitude exponent to create the final fractional order control system. The integrator component from U.S. Patent Application Publication No. 2015/0058388 includes an equation of $$\frac{K}{s^{\frac{\beta}{2}}}.$$

If $\beta=0$, men a IC value of approximately 0.8913 will produce a one-decibel drop over the entire range of positive and negative frequencies from 1/N (where N is a number of samples associated with a window of a Fourier transform) to the Nyquist frequency in the positive frequencies and back to 1/N in the negative frequencies. In that range, there may be as many frequency regions (i.e., values of s) as desired to achieve a desired granularity. For example, a fractional scaling digital filter transfer function complex number array may be represented by $H[s]=x_{[s]}+jy_{[s]}$. Thus, for every point (i.e., s) there is a value for $H=x+jy$. Using the integrator component of the filter library as the filter transfer function with $\beta=0$ and a K value of 0.8913 produces an array for H[s] where every value is identical no matter the value of the frequency (excluding zero)-producing a one decibel drop.

At this point, an altitude exponent (i.e., æ) may be combined to the transfer function H[s] such that the fractional scaling digital filter may be $H[s]=(x_{[s]}+jy_{[s]})^{æ[s]}$. Therefore, the value of the altitude exponent for a region (i.e., a value or set of values of s) will control an amount of attenuation or amplification of that region. As noted above, the altitude exponent for a frequency region may be just for magnitude, just for phase, or both.

Using the phoneme example above, values for the magnitude altitude exponent may be determined by subtracting (in bode space) an input signal from a desired output. Then the magnitude ($M[s]_{æ}$) of the transfer function may be computed for each value of s using the preliminary transfer function and the altitude exponent. The phase ($\theta[s]$) may be determined using a linear subtraction of a phase of the input from a phase of the desired output. Once the magnitude and phase are known, the transfer function may be represented in rectangular form as $H[s]=((M[s]_{æ}*\cos(\theta[s]))+(M[s]_{æ}*\sin(\theta[s])))$.

The flexibility of this filter design using an integrator component modified by the altitude exponent at frequency regions allows for a user draw a desired filter response via a graphical user interface on a computer. Then, altitude exponents are derived from the desired filter response and applied to an integrator component as described above.

Figure 8:
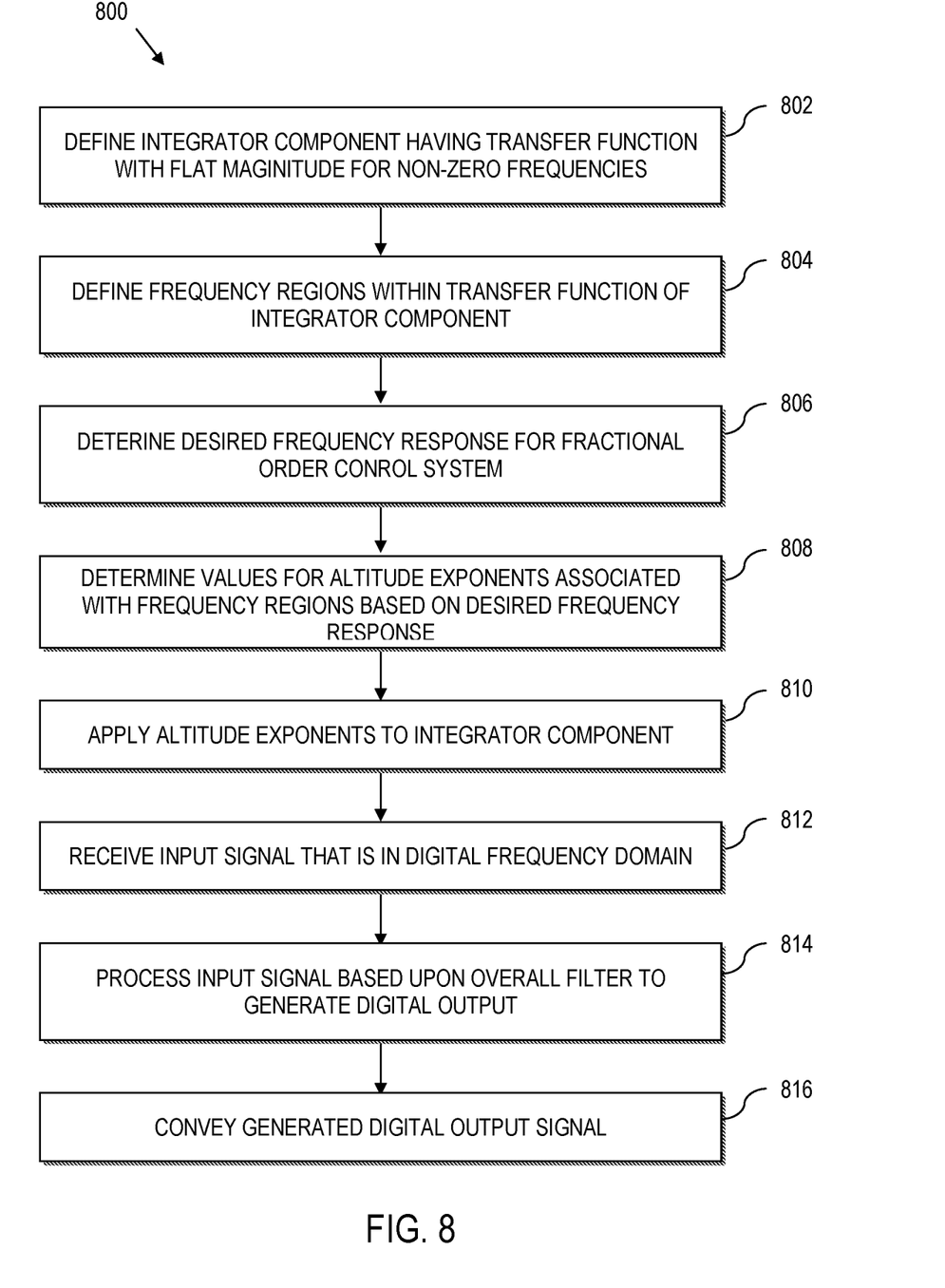
FIG. 8 is a flow chart illustrating a process for processing a digital signal using an integrator component and altitude exponents, according to various aspects of the present disclosure.

FIG. 8 is a flow chart that illustrates a process for using an integrator component with frequency regions associated with altitude exponents to process a digital signal. At 802, an integrator component having a transfer function with a flat magnitude for all non-zero frequencies is defined. For example, the integrator component discussed above with a $\beta=0$ of zero and a K=0.8913 may be used.

At 804, frequency regions are defined within the transfer function of the integrator component. For example, there may be two-hundred fifty-six frequency regions defined within the transfer function. However, any number of frequency regions may be defined.

At 806, a desired frequency response for a fractional order control system is determined. For example, a desired output (e.g., a phoneme in the example above) may be the desired frequency response. As another example, the desired output may be drawn in a graphical user interface, as discussed above.

At 808, values for altitude exponents associated with the frequency regions are determined based on the desired frequency response. For example, a desired output (e.g., a certain phoneme in a person's voice, a drawn desired output) may be defined. Further, the desired output is divided into frequency regions that are similar to the frequency regions of the integrator component. For example, the number of frequency regions of the desired output may be identical or different from the number of frequency regions in the integrator component (e.g., if there are sixty-four frequency regions in the integrator component, then the desired output may also have sixty-four frequency regions). Further, the frequency regions may have the same frequency range or a different frequency range. Then a difference in magnitude in bode space between the desired output and an input signal is calculated for each region to derive the altitude exponent for each frequency region.

As another example, a user may draw a desired output via a graphical user interface and the altitude exponents may be derived from the drawn desired output. A further example includes receiving a value for a specific altitude exponent from an input (e.g., an audio equalizer).

At 810, the altitude exponents are applied to the integrator component. For example, the altitude exponent (i.e., æ) may be combined to the transfer function H[s] such that the equation representing the fractional order control system is $H[s]=(x_{[s]}+jy_{[s]})^{æ[s]}$. Therefore, the value of the altitude exponent for a region (i.e., a value or set of values of s) will control an amount of attenuation or amplification of that region.

At 812, an input signal in the frequency domain is received. At 814, the digital input signal in the frequency domain is processed using the fractional order control system to generate an output signal that may be in the frequency domain or in the time domain as desired, and at 816, that output signal is conveyed.

Figure 9:
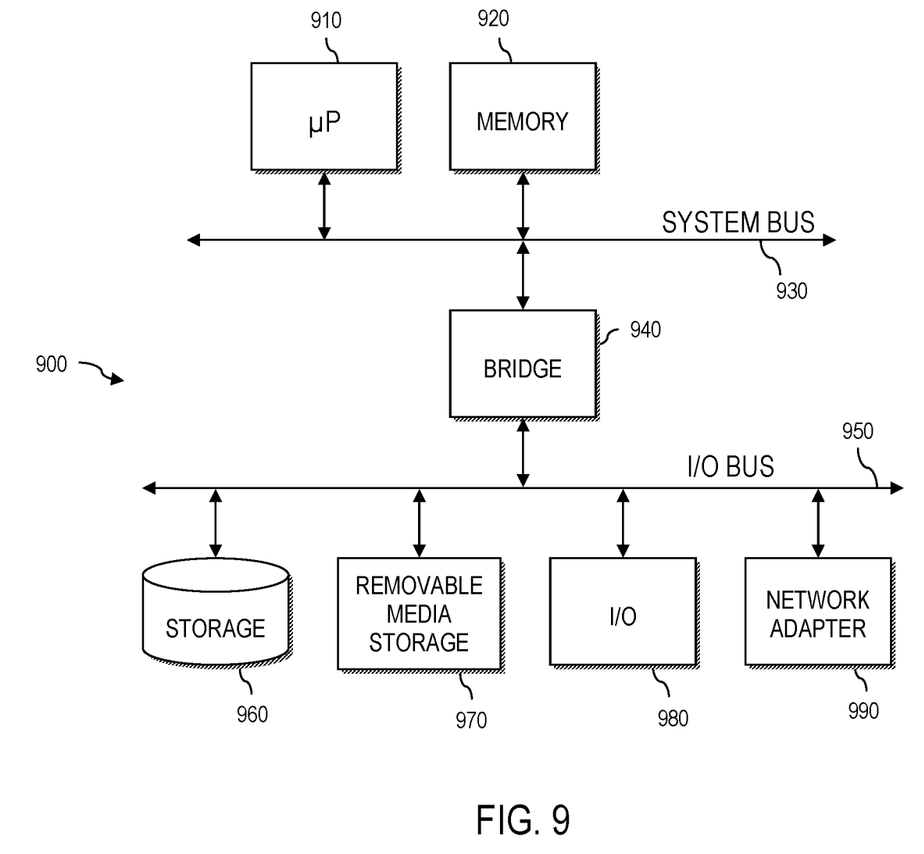
FIG. 9 is a block diagram of a computer system having a computer readable storage medium for implementing functions according to various aspects of the present invention as described in greater detail herein.

Referring to FIG. 9, a block diagram of a data processing system is depicted in accordance with the present invention. Data processing system 900 may comprise a symmetric multiprocessor (SMP) system or other configuration including a plurality of processors 910 connected to a memory 920 through a system bus 930. Alternatively, a single processor 910 may be employed. An I/O bus bridge 940 is connected to the system bus 930 and provides an interface to an I/O bus 950. The I/O bus may be utilized to support one or more buses and corresponding devices, such as bus bridges, storage 960, removable media storage 970, input output devices (I/O devices) 980, network adapters 990, etc. Network adapters may also be coupled to the system to enable the data processing system to become coupled to other data processing systems or remote printers or storage devices through intervening private or public networks.

Also connected to the I/O bus 950 may be devices such as a graphics adapter. The removable media storage 970 (or the storage 960 or memory 920) may include a computer usable program code embodied thereupon. The computer usable program code may be executed to implement any aspect of the present invention, for example, to implement any aspect of any of the methods and/or system components illustrated in FIGS. 1-8.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable storage medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM), Flash memory, an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer storage medium does not include propagating signals.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Network using an Network Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. Aspects of the disclosure were chosen and described in order to best explain the principles of the invention and the practical application, and to enable others of ordinary skill in the art to understand the invention for various embodiments with various modifications as are suited to the particular use contemplated.

What is claimed is:

1. A process for processing a digital signal, the process comprising:
    constructing a fractional order control system that models a desired frequency response by assembling filter components from a filter component library, wherein the filter components are defined by Laplace functions that have a non-integer control order having a variable fractional scaling exponent;
    adjusting the fractional order control system by applying an altitude exponent to the fractional order control system, wherein the altitude exponent applies to a complex number array of the fractional order control system to change a magnitude of the frequency response without changing a width of a transition band of the frequency response;
    receiving an input signal that is in a digital frequency domain;
    processing the input signal based upon the fractional order control system to generate a digital output; and
    conveying the generated digital output signal.

2. The process of claim 1, wherein constructing a fractional order control system further comprises constructing the fractional order control system that models the desired frequency response by assembling the filter component with a second filter component from the filter component library, wherein the second filter component is defined by a Laplace function that includes a non-integer control order having a variable fractional scaling exponent, wherein the transition band is between a gain frequency of the filter component and a gain frequency of the second filter component.

3. The process of claim 2, wherein adjusting the fractional order control system by applying an altitude exponent to the fractional order control system further comprises adjusting an amplitude of the filter component by applying a first altitude exponent to the filter component and adjusting an amplitude of the second filter component by applying a second altitude exponent to the second filter component.

4. The process of claim 2, wherein adjusting the fractional order control system by applying an altitude exponent to the fractional order control system further comprises adjusting an amplitude of the filter component by applying a first altitude exponent to the filter component and adjusting an amplitude of the second filter component by applying a second altitude exponent to the second filter component, wherein the first altitude exponent is different from the second altitude exponent.

5. The process of claim 1, wherein adjusting the fractional order control system by applying an altitude exponent to the fractional order control system further comprises adjusting the fractional order control system by applying a positive altitude exponent to the fractional order control system to change an existing magnitude of a non-zero portion of the frequency response without changing a transition band of the frequency response.

6. The process of claim 1, wherein adjusting the fractional order control system by applying an altitude exponent to the fractional order control system further comprises adjusting the fractional order control system by applying a negative altitude exponent to the fractional order control system to flip an existing magnitude of a non-zero portion of the frequency response without changing a transition band of the frequency response.

7. The process of claim 1, further comprising adjusting the amplitude of all portions of the fractional order control system by applying an overall shifting factor.

8. The process of claim 7, wherein adjusting the amplitude of all portions of the fractional order control system by applying an overall shifting factor comprises adjusting the amplitude of all portions of the fractional order control system by applying an overall shifting factor that is determined based on the transition band.

9. The process of claim 7, wherein adjusting the amplitude of all portions of the fractional order control system by applying an overall shifting factor comprises adjusting the amplitude of all portions of the fractional order control system by applying an overall shifting factor that is determined based on a passband.

10. A process for processing a digital signal, the process comprising:
    defining a unit filter that includes:
        a leading transition band;
        a trailing transition band;
        a passband over a frequency range; and
        an altitude exponent that affects a height of the passband over the frequency range by applying a complex number array, the altitude exponent changes the height of the passband without changing a gain frequency of the unit filter and without changing a width of the passband over the frequency;
    combining a first instance of the unit filter with a second instance of the unit filter to create an overall filter with a desired frequency range where the first unit filter is combined with the second unit filter such that the trailing transition band of the first unit filter overlaps the leading transition band of the second unity filter;

adjusting the altitude exponent of the first unit filter and the altitude exponent of the second unit filter such that the overall filter has a desired frequency response over the desired frequency range;

receiving an input signal that is in a digital frequency domain;

processing the input signal based upon the overall filter to generate a digital output; and conveying the generated digital output signal.

11. A process for processing a digital signal, the process comprising:

defining an integrator component having a transfer function with a flat magnitude for non-zero frequencies;

defining frequency regions within the transfer function of the integrator component;

determining a desired frequency response for a fractional order control system;

determining values for altitude exponents associated with the frequency regions based on the desired frequency response, each altitude exponent applies to a complex number array of the fractional order control system to modify a magnitude of at least one frequency region without changing a width of the at least one frequency region;

applying the altitude exponents to the integrator component;

receiving an input signal that is in a digital frequency domain;

processing the input signal based upon the overall filter to generate a digital output; and conveying the generated digital output signal.

12. The process of claim 11, wherein determining a desired frequency response comprises:

defining a desired output;

defining frequency regions within the desired output similar to the frequency regions of the integrator component; and calculating a difference in bode space between a magnitude of the desired output and a magnitude for the input signal for each frequency region of the desired output.

13. The process of claim 11, wherein determining a desired frequency response comprises:

receiving a desired output from a user via a graphical user interface; and calculating an altitude exponents based on the received desired output.

14. The process of claim 11, wherein determining a desired frequency response comprises:

receiving values for the altitude exponents from an input.

* * * * *